United States Patent [19]

Okamoto et al.

[11] Patent Number: 4,707,723

[45] Date of Patent: Nov. 17, 1987

[54] SEMICONDUCTOR DEVICE USING A REFRACTORY METAL AS AN ELECTRODE AND INTERCONNECTION

[75] Inventors: Tatsuo Okamoto; Masahiro Shimizu; Katsuhiro Tsukamoto, all of Itami, Japan

[73] Assignee: Mitsubishi Denki Kabushiki Kaisha, Tokyo, Japan

[21] Appl. No.: 830,129

[22] Filed: Feb. 18, 1986

[30] Foreign Application Priority Data

Mar. 8, 1985 [JP] Japan .................................. 60-47031

[51] Int. Cl.$^4$ .......................................... H01L 23/54
[52] U.S. Cl. ...................................... 357/67; 357/71; 357/59
[58] Field of Search ............................. 357/67, 71, 59

[56] References Cited

U.S. PATENT DOCUMENTS 3,855,612  12/1974  Rosvold ................................. 357/67
4,507,851  4/1985   Joyner et al. ......................... 357/71
4,566,021  1/1986   Yokoyama ............................ 357/67

OTHER PUBLICATIONS

"MO/Ti Bilayer Metallization for a Self-Aligned TiSi$_2$ Process", H. K. Park et al., American Vacuum Society, Journal of Vacuum Science Technology, A, vol. 2, No. 2, Apr.-Jun. 1984, pp. 259-263.

"Refractory Silicide for Integrated Circuits", by S. P. Murarka, American Vacuum Society # J. Vac. Sci. Technol., vol. 17, No. 4, Jul./Aug. 1980, pp. 775 to 792.

Primary Examiner—Andrew J. James
Assistant Examiner—S. V. Clark
Attorney, Agent, or Firm—Lowe, Price, LeBlanc, Becker & Shur

[57] ABSTRACT

A semiconductor device in which a multilayer film comprising a low resistance refractory metal silicide film and a low resistance ternary alloy film formed thereon and having corrosion resistance to hydrofluoric acid is used as an electrode and interconnection. The above stated low resistance refractory metal silicide is titanium silicide or tantalum silicide. The above stated ternary alloy is titanium-M-silicon or tantalum-M-silicon, M being any of molybdenum, tungsten, niobium, vanadium and tantalum.

9 Claims, 13 Drawing Figures

SEMICONDUCTOR DEVICE USING A REFRACTORY METAL AS AN ELECTRODE AND INTERCONNECTION

BACKGROUND OF THE INVENTION

1. Field of the Invention

The present invention relates to a semiconductor device using a refractory metal as an electrode and interconnection. Particularly, the present invention relates to a structure of a metal interconnection and electrode in a very large scale integrated (VLSI) circuit device.

2. Description of the Prior Art

FIGS. 1A to 1E are sectional views showing major steps of manufacturing of a conventional semiconductor device using a refractory metal as an electrode and interconnection. In the following, a method of manufacturing of a conventional semiconductor device will be described with reference to FIGS. 1A to 1E.

Referring to FIG. 1A, thick oxide films 2a and 2b serving as cell isolation regions are formed selectively in predetermined regions on a major surface of a silicon semiconductor substrate 1 by using a thermal oxidation process or the like. Then, a thin gate oxide film 3 is formed on the semiconductor substrate 1 by a thermal oxidation process and after that, an impurity 4 such as boron, phosphorous or arsenic is implanted through the gate oxide film 3 so as to control a threshold voltage of a MOS (metal-oxide-semiconductor) type transistor.

Referring to FIG. 1B, a polycrystalline silicon film 5 is formed on the oxide films 2a, 2b and 3 by using a CVD process or the like and a refractory metal silicide film 6 of titanium silicide or tantalum silicide is further formed on the polycrystalline silicon film 5 by using a sputtering process, a vacuum evaporation process, a CVD process or the like. Then for the purpose of patterning the polycrystalline silicon film 5 and the refractory metal silicide film 6, a resist film 8 is selectively provided in a predetermined region by a photolithography process.

Referring to FIG. 1C, etching is applied using the resist film 8 as a mask so that the polycrystalline silicon film 5 and the refractory metal silicide film 6 are patterned in a predetermined form. Subsequently, by an ion implantation process, a thermal diffusion process or the like, ion introduction is made using the resist film 8 as a mask so that impurity diffusion layers 9a and 9b are formed. The impurity diffusion layers 9a and 9b serve as source and drain regions of a MOS transistor.

Referring to FIG. 1D, the resist film 8 is removed and after that, for the purpose of electrical separation of an electrode and interconnection, silicon oxide films 10a, 10b and 10c are formed by a CVD process, a sputtering process or the like. Subsequently, contact holes 11a and 11b for providing an electrode and interconnection are formed in predetermined regions by a photolithography and etching process. Then, an impurity such as phosphorous is introduced in self-alignment manner through the contact holes 11a and 11b by a thermal diffusion process, an ion implantation process or the like, for purposes of reduction of contact resistance.

Referring to FIG. 1E, an aluminum-alloy film serving as an electrode and interconnection is formed over the whole exposed surface by a sputtering process, a vacuum evaporation process, a CVD process or the like and after that, the aluminum alloy film is patterned by a photolithography and etching process so that electrode interconnection films 12a and 12b are formed. After the above described steps, an insulating film or a passivation film, not shown, is formed and thus, the manufacturing of a MOS transistor using a refractory metal as an electrode and interconnection is completed.

Recently, integrated circuit devices have tended to be of a high density and a high degree of integration and accordingly, it happens that an RC delay in signal (R: resistance, C: parasitic capacitance) is caused by an interconnection resistance of a device, resulting in lowering of the operation speed of the device. Under the circumstances, in order to overcome the above stated drawback, there is an increasing tendency to use as a material for a gate electrode and interconnection, a refractory metal silicide having a low specific resistance (that is, an alloy of a refractory metal and silicon) in place of polycrystalline silicon widely utilized in the conventional art. Among refractory metal silicides, a silicide of molybdenum Mo and a silicide of tungsten W are excellent in corrosion resistance to hydrofluoric acid, but they are both disadvantageous in that the specific resistance is relatively high.

Therefore, approaches are being made to lower the resistance of an electrode and interconnection by using a silicide of titanium or tantalum having a lower specific resistance. However, the manufacturing processes of a semiconducuctor wafer of LSI (large scale integrated circuit) include various chemical treatment steps and therefore, it is particularly necessary for the electrode and interconnection to have an excellent characteristic in corrosion resistance to chemicals containing hydrofluoric acid. For example, in the step shown in FIG. 1E, a light-etching process is applied using chemicals containing hydrofluoric acid before the aluminum-alloy films 12a and 12b are formed. In this light etching, the oxide films (of phosphosilicate glass or silicon oxide or the like) formed as a result of thermal diffusion of an impurity such as phosphorous and the natural oxide films, formed on the surfaces of the impurity diffusion layers 9a and 9b, are completely removed so that the aluminum alloy films 12a and 12b can be stably brought into contact with a gate electrode interconnection film (a film comprised of polycrystalline silicon 5 and a refractory metal silicide 6) and the impurity diffusion layer 9b, respectively, to lower the contact resistance. However, in this light etching it is necessary not to etch the underlying gate electrode interconnection film. This is based on the below described reasons. The contact resistance consists of a resistance in contact between the refractory metal silicide 6 and the aluminum-alloy film 12a and an increase of resistance associated with an increase of a current density in the refractory metal silicide film 6 in the contact hole. Therefore, in the etching process, as the thickness of the refractory metal silicide film 6 in the contact hole becomes thin, the current density in the refractory metal silicide film 6 increases largely as compared with the case of the film 6 being thick, and as a result, electric current cannot flow easily and the contact resistance is increased. Furthermore, if the low resistance refractory metal silicide film 6 is completely removed and the underlying polysilicon film 5 is exposed, the contact resistance increases excessively.

FIGS. 2A and 2B are views showing a light etching process in a gate electrode interconnection film. The above stated problem will be considered in the following with reference to FIGS. 2A and 2B, the portions corresponding to those in FIGS. 1A to 1E being denoted by the same reference numerals.

Referring to FIG. 2A, an oxide film (a silicon oxide film or phosphosilicate glass) 13 formed on the refractory metal silicide film 6 is removed by a light etching process using chemicals containing hydrofluoric acid. The refractory metal silicide film 6 as the underlying base for the oxide film 13 is formed of titanium silicide or tantalum silicide having a low resistance and it has an inferior characteristic in corrosion resistance to chemicals containing hydrofluoric acid.

Referring to FIG. 2B, when the underlying electrode interconnection film 6 is formed of titanium silicide or tantalum silicide, the selectivity of etching with chemicals containing hydrofluoric acid with respect to the oxide film 13 and the underlying refractory metal silicide film 6 is not satisfactory, and therefore the underlying refractory metal silicide film 6 is etched excessively. As a result, the thickness of the refractory metal silicide film 6 becomes thinner or in a further case the underlying silicon film 5 is exposed, resulting in an increase in the sheet resistance and the contact resistance of the metal silicide film 6.

On the other hand, although molybdenum silicide $MoSi_2$ and tungsten silicide $WSi_2$ are excellent in corrosion resistance to chemicals containing hydrofluoric acid, they are disadvantageous in that the specific resistance values of $WSi_2$ and $MoSi_2$ are respectively 70 $\mu\Omega cm$ and 100 $\mu\Omega cm$, which are higher than the specific resistance values 1.5 $\mu\Omega cm$ and 30 $\mu\Omega cm$ of titanium silicide $TiSi_2$ and tantalum silicide $TaSi_2$ respectively. The physical and chemical properties of refractory metal silicides are described for example in "Refractory silicides for integrated circuits", by S. P. Murarka, American Vacuum Society #J. Vac. Sci. Technol., Vol. 17, No. 4, Jul./Aug. 1980, pp. 775 to 792.

A method in which a titanium film Ti is in advance covered with a molybdenum film Mo for the purpose of preventing oxidation of the surface of Ti at the time of siliciding the titanium on a silicon substrate is disclosed in "Mo/Ti bilayer metalization for a self-aligned $TiSi_2$ process", by H. K. Park et al., American Vacuum Society #J. Vac. Sci. Technol. A, Vol. 2, No. 2, Apr.–June 1984, pp. 259 to 263. In this prior art, Mo is not silicided.

SUMMARY OF THE INVENTION

An object of the present invention is to provide a semiconductor device using a refractory metal as an electrode and interconnection, having both a low resistance and an excellent characteristic in corrosion resistance to chemicals containing hydrofluoric acid.

An electrode and interconnection film using a refractory metal in accordance with the present invention is of a multilayer structure comprising a refractory metal silicide film of a low resistance and a ternary alloy film of a low resistance formed on the refractory metal silicide film and having corrosion resistance to chemicals containing hydrofluoric acid. The low resistance refractory metal silicide film is formed of titanium silicide or tantalum silicide. The ternary alloy film is formed of titanium-refractory metal-silicon or tantalum-refractory metal-silicon. The refractory metal contained in the ternary alloy is any of molybdenum, tungsten, niobium, vanadium and tantalum. In this multilayer structure of the metal electrode and interconnection film, the underlying low resistance refractory metal silicide film contributes to lowering of resistance and the upper ternary alloy film serves to prevent the underlying low resistance refractory metal silicide film from being corroded by the chemicals containing hydrofluoric acid.

The above described object and other objects and features of the present invention will become more apparent from the following detailed description when taken in conjunction with the accompanying drawings.

DESCRIPTION OF THE PREFERRED EMBODIMENTS

The present invention will be described in connection with a case in which the present invention is applied to a gate electrode and interconnection in a MOS transistor.

FIGS. 3A to 3E are sectional views showing major steps of manufacturing of a semiconductor device of an embodiment of the present invention. The following description will be made with reference to FIGS. 3A to 3E.

Figure 1A:
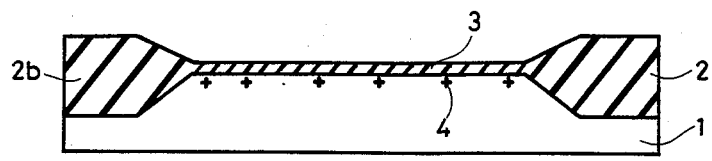
FIGS. 1A to 1E are sectional views showing major steps of manufacturing of a conventional semiconductor device.
Figure 1B:
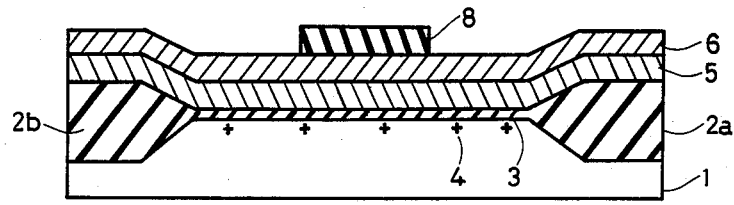
Figure 1C:
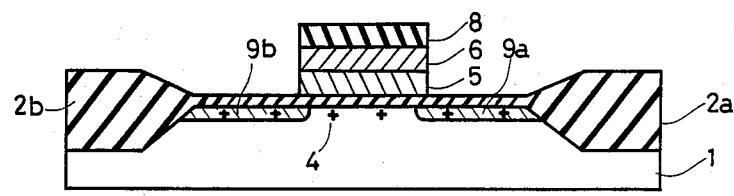
Figure 1D:
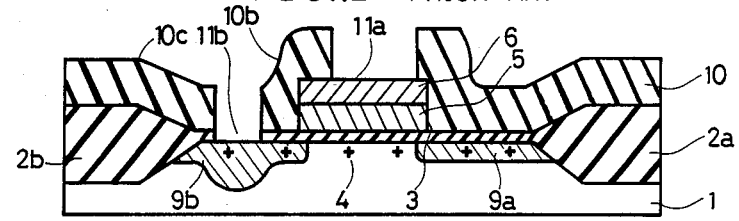
Figure 1E:
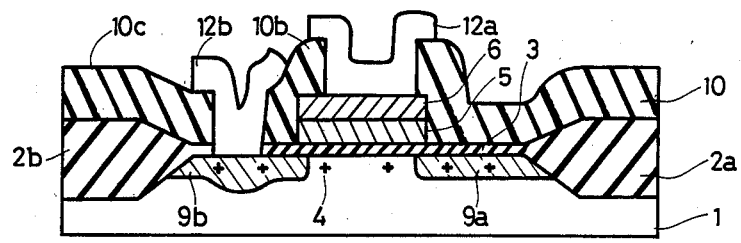
Figure 2A:
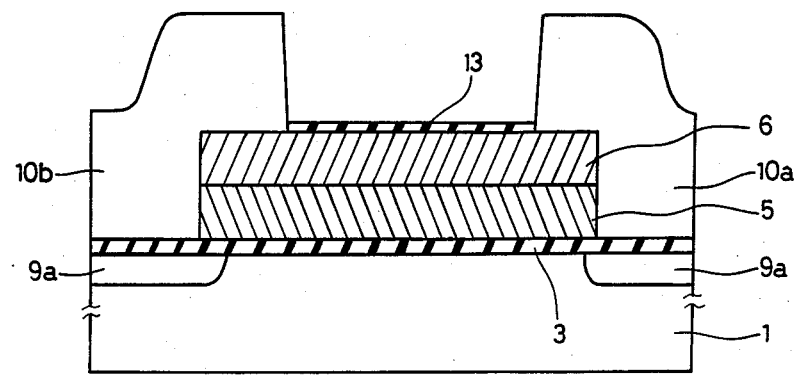
FIG. 2A and 2B are sectional views showing an etching process using chemicals containing hydrofluoric acid for a gate electrode and interconnection film in a conventional semiconductor device.
Figure 2B:
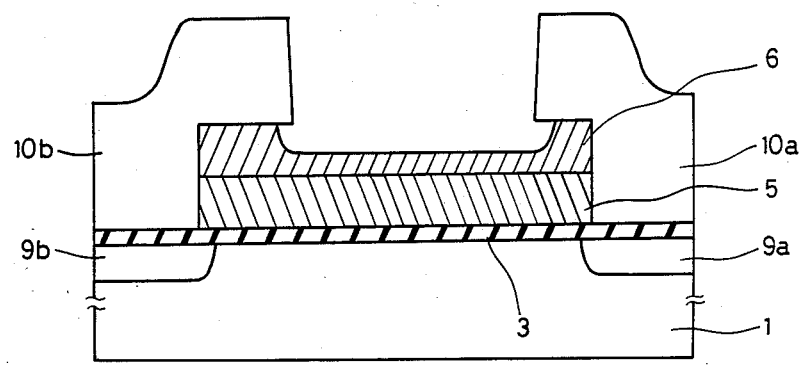
Figure 3A:
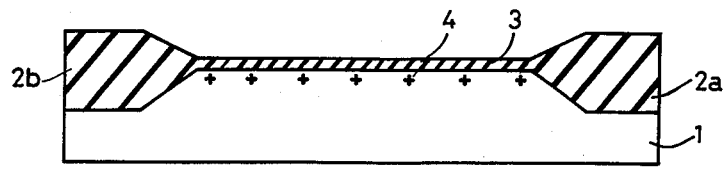
FIG. 3A to 3E are sectional views showing major steps of manufacturing of a semiconductor device using a refractory metal as an electrode and interconnection in accordance with an embodiment of the present invention.

In the step shown in FIG. 3A, thick oxide films 2a and 2b for cell isolation are formed selectively on a silicon semiconductor substrate 1 and a thin gate oxide film 3 is formed on the surface of the silicon substrate 1 by a thermal oxidation process and further, an impurity layer 4 is formed by introduction of an impurity such as boron, phosphorous or arsenic by an ion implantation process or the like so as to determine a threshold voltage of the MOS transistor. This step in FIG. 3A is the same as the manufacturing step of a conventional semiconductor device shown in FIG. 1A.

Figure 3B:
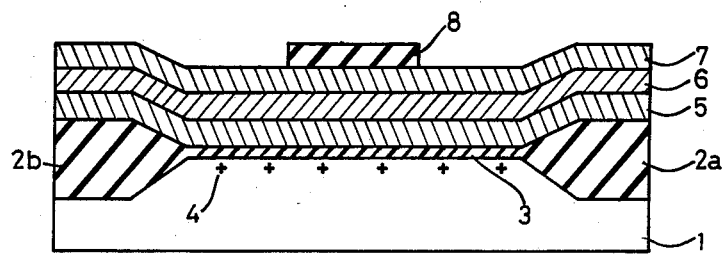

Referring to FIG. 3B, a polycrystalline silicon film 5 is formed on the oxide films 2a, 2b and 3 by a CVD process or the like. On the polycrystalline silicon film 5, a titanium silicide film ($TiSi_X$) 6 is formed by a sputtering process, a vacuum evaporation process, a CVD process or the like. Then, a ternary alloy film ($Ti_XMo_YSi_Z$) 7 of titanium-molybdenum-silicon is formed by a sputtering process, a vacuum evaporation process, a CVD process or the like, which constitutes a characteristic feature of the present invention. Finally, a resist film 8 serving as an etching mask is formed in a predetermined region by a photolithography process in order that an electrode and interconnection may be patterned.

Figure 3C:
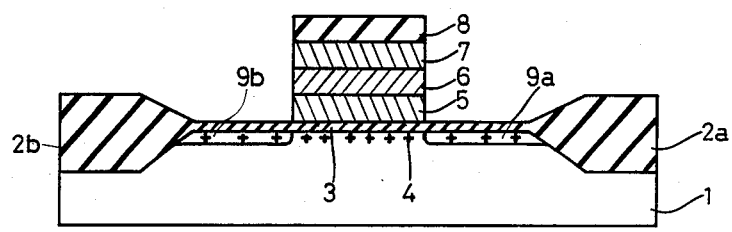

Referring to FIG. 3C, using the patterned resist film 8 as an etching mask, etching is applied to the titanium-molybdenum-silicon ($Ti_XMo_YSi_Z$) film 7, the titanium silicide ($TiSi_X$) film 6 and the polycrystalline silicon film 5 successively in this order. Subsequently, for the purpose of forming source and drain regions, an impurity such as arsenic, phosphorous or boron is introduced into the surface region of the substrate 1 by an ion implantation process or a thermal diffusion process so that impurity diffusion layers 9a and 9b are formed. After that, the resist film 8 is removed and in some cases, if desired, heat treatment is applied at a temperature of approximately 600° C. to 1200° C. so as to eliminate defects caused by the introduction of the impurity or other factors.

Figure 3D:
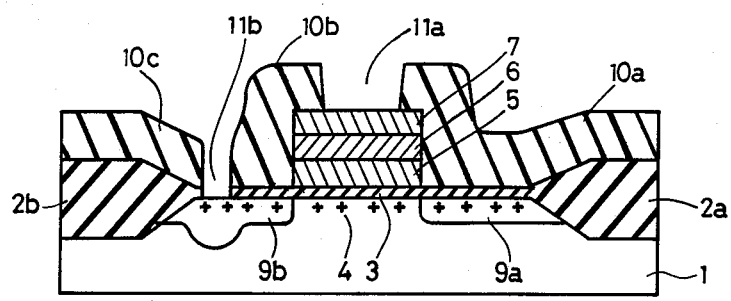

Referring to FIG. 3D, silicon oxide films 10a, 10b and 10c containing, if necessary, the impurity such as boron, phosphorous or arsenic are formed over the whole exposed surface by a CVD process, a sputtering process, a coating process or the like. Then for the purpose of providing an electrode and interconnection, contact holes 11a and 11b are formed in predetermined regions by a photolithography and etching process. In this process, contact holes are also formed on the impurity diffusion layer 9a, though not shown in the drawing for the purpose of simplification. After that, an impurity such as phosphorous is introduced and diffused in self-alignment manner through the contact holes 11a and 11b into the substrate 1 and the gate electrode and interconnection comprising the titanium-molybdenum-silicon film 7, the titanium silicide film 6 and the polycrystalline silicon 5, so that the contact resistance may be lowered.

Figure 3E:
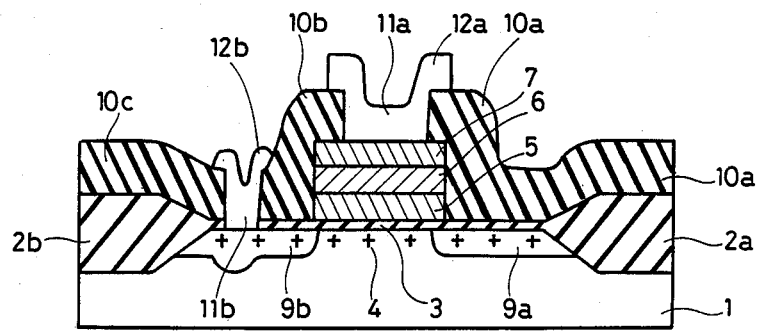

Referring to FIG. 3E, aluminum alloy films 12a and 12b are formed by a sputtering process, a vacuum evaporation process, a CVD process or the like and subsequently, the aluminum alloy films 12a and 12b are patterned by a photolithography and etching process.

During a period after the completion of the patterning of the gate electrode and interconnection (shown in FIG. 3C) and before the step of forming the aluminum alloy films 12a and 12b (shown in FIG. 3D), a treatment using chemicals and a heat treatment are applied several times. The most severe process for the titanium silicide film 6 is the process in which in order to ensure the formation of a stable ohmic contact a chemical treatment is applied using chemicals containing hydrofluoric acid to remove the oxide films formed in the vicinity of the bottom surfaces of the contact holes 11a and 11b after the implantation and diffusion of an impurity such as phosphorous in self-alignment manner into the substrate 1 and the surface of the gate electrode and interconnection through the contact holes 11a and 11b to lower the contact resistance and to ensure the formation of a diffusion layer below the contact hole 11b. In the case of applying the above described process in the conventional device, etching could not be stopped at the time when the surface of the titanium silicide film 6 was exposed, and the titanium silicide film 6 would be unavoidably etched. By contrast, in the present invention, the titanium silicide 6 will never be etched because the $Ti_xMo_ySi_z$ film 7 having advantages of both titanium silicide and molybdenum silicide, namely, a low resistance of titanium silicide and a high corrosion resistance of molybdenum silicide to hydrofluoric acid is formed on the titanium silicide film 6. In order to enhance the above described effect of the $Ti_xMo_ySi_z$ film, it is necessary to control the composition ratio (X, Y, Z) suitably. More specifically, the composition ratio in the vicinity of the surface of the $Ti_xMo_ySi_z$ film is made to be approximately $0 < X/Y \leq 1$ so as to enhance the corrosion resistance to hydrofluoric acid and the composition ratio in the vicinity of the interface with the titanium silicide film 5 is made to be $1 \leq X/Y < \sim$ so that the $Ti_xMo_ySi_z$ film as a whole has a low resistance and a high corrosion resistance.

As an example, a film of $TiSi_2$ is formed to a thickness of 1700 521 and a film of $Ti_xMo_ySi_z$ is formed thereon to a thickness of 1000 Å using the above described method as shown in FIG. 3. In this case, the composition in the vicinity of the surface of the $Ti_xMo_ySi_z$ film is $Ti_{0.1}Mo_{0.9}Si_z$ and the composition in the vicinity of the interface with the $TiSi_2$ film is $Ti_{0.9}Mo_{0.1}Si_z$. The composition in the depth direction is $Ti_xMo_ySi_2$ (X+Y=1) so that both of X and Y are linearly changed substantially along the depth direction. The above described change in the composition ratio can be made easily by a conventional film forming process. For the purpose of comparion, a film of $TiSi_2$ was formed to a thickness of 2700 Å by the same manufacturing method as for the above described sample. A multilayer film using a ternary alloy film and a single-layer film of titanium silicide were subjected to a heat treatment at 950° C. for 60 minutes in an atmosphere of nitrogen and then the sheet resistances thereof were measured. The sheet resistance of the $TiSi_2$ single-layer film of 2700 Å was 0.4 to 0.5 $\Omega/\Box$ and the sheet resistance of the bilayer film was 0.5 to 0.6 $\Omega/\Box$. Thus, the resistance values were almost equal.

Further, the etching time with respect to diluted hydrofluoric acid (HF:H$_2$=1:50) for the bilayer film (having a total thickness of 2700 Å) and that for the $TiSi_2$ film having the same thickness were measured. In the case of the bilayer film, the time required for etching the whole film was approximately three times as long as that in the $TiSi_2$ single-layer film. Thus, the bilayer film in accordance with the present invention has a more excellent characteristic in corrosion resistance to hydrofluoric acid than in the conventional single-layer film.

Figure 4:
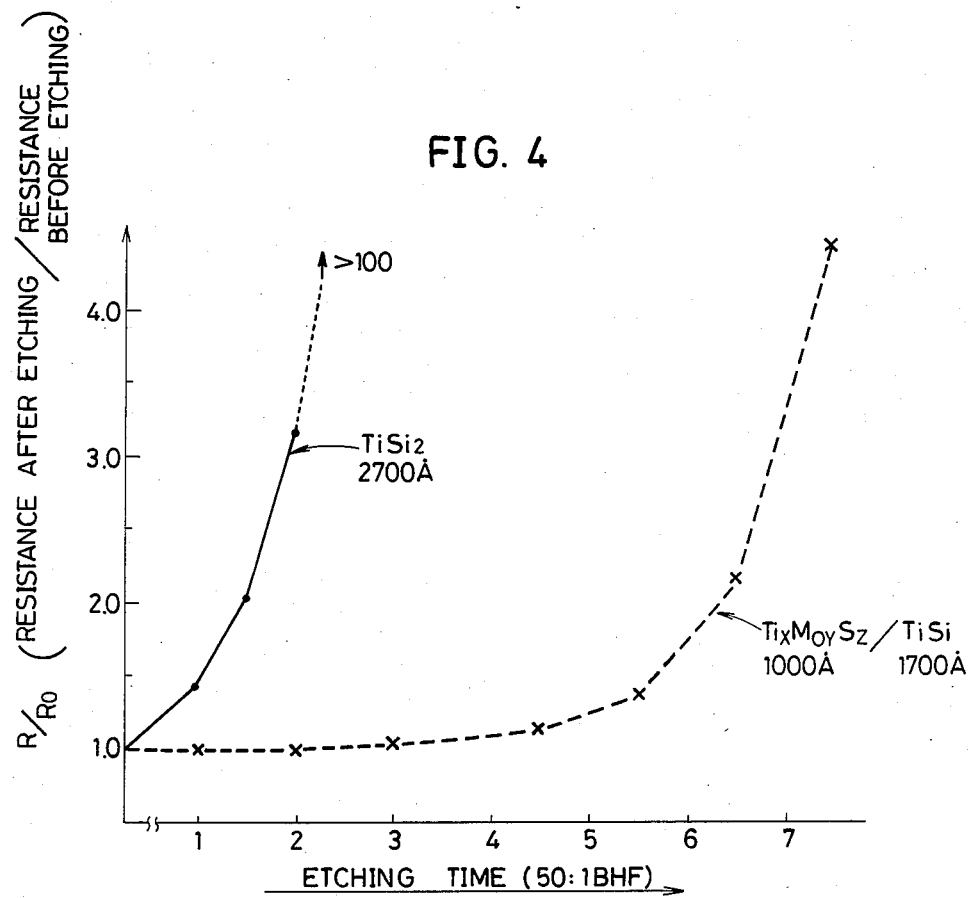
FIG. 4 is a graph showing a relation between the etching time using chemicals containing hydrofluoric acid and the sheet resistance ratio in a multilayer film comprising a ternary alloy film in accordance with an embodiment of the present invention and in a single-layer film of titanium silicide.

FIG. 4 shows the result of comparison between the bilayer film of the present invention and the titanium silicide single-layer film concerning the etching time and the sheet resistance ratio in case of using a buffer solution of NH$_4$F:HF=50:1. In FIG. 4, the horizontal axis represents the etching time (minutes) and the vertical axis represents a ratio between a sheet resistance before the etching and a sheet resistance after the etching. In addition, the solid line shows the sheet resistance ratio of the single-layer film and the broken line shows the sheet resistance ratio of the bilayer film. As seen from FIG. 4, in the bilayer film using a ternary alloy film in accordance with the present invention, the etching rate is extremely low as compared with the conventional titanium silicide single-layer film and the resistance is not easily increased by the etching of the film.

In the above described embodiment, titanium silicide was used as a refractory metal silicide and a titanium-molybdenum-silicon ternary alloy film was used as a ternary alloy film. However, the present invention is not limited thereto and if tantalum is used instead of titanium and if a transition metal such as tungsten, niobium, vanadium or tantalum is used instead of molybdenum, the same effect can be obtained.

In addition, although the case of the gate electrode and interconnection of a MOS transistor was described in the above embodiment, the present invention is applicable to other multilayer interconnection films and in such cases, the same effect can be also obtained.

As described above, according to the present invention, a ternary alloy film having corrosion resistance to chemicals containing hydrofluoric acid and a lower resistance than that of molybdenum silicide or the like is formed on a metal silicide film of a low resistance. Thus, the present invention make it possible to obtain a semiconductor device comprising metal electrode and interconnection having a low resistance and an excellent characteristic in corrosion resistance to chemicals containing hydrofluoric acid.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including a refractory metal in an electrode and interconnection of a multilayer structure formed on a semiconductor substrate, said electrode and interconnection comprising:
   a low resistance metal silicide layer, and
   a refractory ternary alloy layer of a low resistance formed on said low resistance metal silicide layer and having corrosion resistance to chemicals containing hydrofluoric acid, said ternary alloy layer comprising a first refractory metal, a second refractory metal and silicon.

2. A semiconductor device using a refractory metal as an electrode and interconnection in accordance with claim 1, wherein
   said low resistance metal silicide layer is a layer formed of titanium silicide.

3. A semiconductor device using a refractory metal as an electrode and interconnection in accordance with claim 1, wherein
   said low resistance metal silicide layer is a layer formed of tantalum silicide.

4. A semiconductor device using a refractory metal as an electrode and interconnection in accordance with claim 1, wherein
   assuming that said ternary alloy is represented as $R_X M_Y Si_Z$, X and Y satisfy the conditions:
   $0 < X/Y \leq 1$ in the vicinity of the top surface of said ternary alloy layer, and
   $1 \leq X/Y < \sim$ in the vicinity of the bottom surface of said ternary alloy layer.

5. A semiconductor device using a refractory metal as an electrode and interconnection in accordance with claim 4, wherein
   said X and said Y satisfy the condition of $X + Y = 1$ and are changed linearly from the top surface to the bottom surface of said ternary alloy layer.

6. A semiconductor device using a refractory metal as an electrode and interconnection in accordance with claim 1, wherein
   said ternary alloy is titanium-refractory metal-silicon.

7. A semiconductor device using a refractory metal as an electrode and interconnection in accordance with claim 1, wherein
   said ternary alloy is tantalum-refractory metal-silicon.

8. A semiconductor device using a refractory metal as an electrode and interconnection in accordance with claim 6, wherein
   said refractory metal included in said ternary alloy is any one selected among the group including molybdenum, tungsten, niobium, vanadium and tantalum.

9. A semiconductor device using a refractory metal as an electrode and interconnection in accordance with claim 7, wherein
   said refractory metal included in said ternary alloy is any one selected among the group including molybdenum, tungsten, niobium and vanadium.

* * * * *